United States Patent
Ikeda et al.

(10) Patent No.: US 9,844,130 B2
(45) Date of Patent: Dec. 12, 2017

(54) PACKAGE FOR OPTICAL SEMICONDUCTOR DEVICE

(71) Applicants: SHINKO ELECTRIC INDUSTRIES CO., LTD., Nagano (JP); KOREA SHINKO MICROELECTRONICS CO., LTD., Jeollanam-do (KR)

(72) Inventors: Takumi Ikeda, Nagano (JP); Masao Kainuma, Nagano (JP); Yasuyuki Kimura, Nagano (JP); Chang Hun Gang, Jeollanam-do (KR); Tae Uk Gang, Jeollanam-do (KR); Hyung Gon Kim, Jeollanam-do (KR)

(73) Assignees: SHINKO ELECTRIC INDUSTRIES CO., LTD., Nagano (JP); KOREA SHINKO MICROELECTRONICS CO., LTD., Jeollanam-Do (KR)

( * ) Notice: Subject to any disclaimer, the term of this patent is extended or adjusted under 35 U.S.C. 154(b) by 0 days.

(21) Appl. No.: 15/391,053

(22) Filed: Dec. 27, 2016

(65) Prior Publication Data

US 2017/0202081 A1    Jul. 13, 2017

(30) Foreign Application Priority Data

Jan. 8, 2016  (JP) .................... 2016-002347

(51) Int. Cl.
| | |
|---|---|
| *H05K 1/00* | (2006.01) |
| *H05K 1/02* | (2006.01) |
| *H01L 31/0203* | (2014.01) |
| *H01L 31/02* | (2006.01) |
| *H05K 1/11* | (2006.01) |
| *H01S 5/022* | (2006.01) |
| *H01S 5/18* | (2006.01) |

(52) U.S. Cl.
CPC ....... *H05K 1/0274* (2013.01); *H01L 31/0203* (2013.01); *H01L 31/02005* (2013.01);
(Continued)

(58) Field of Classification Search
CPC ...... H05K 1/115; H05K 1/274; H01L 23/495; H01L 23/498; H01L 31/203;
(Continued)

(56) References Cited

U.S. PATENT DOCUMENTS

| | | | | |
|---|---|---|---|---|
| 4,639,988 A | * | 2/1987 | Goto ...................... | H03H 3/02 |
| | | | | 29/25.35 |
| 7,071,491 B2 | * | 7/2006 | Baek ................... | H05K 1/0243 |
| | | | | 257/433 |

(Continued)

FOREIGN PATENT DOCUMENTS

JP    2009-105284    5/2009

*Primary Examiner* — Xiaoliang Chen
(74) *Attorney, Agent, or Firm* — IPUSA, PLLC

(57) ABSTRACT

A package for an optical semiconductor device includes an eyelet, a signal lead inserted in a through hole formed in the eyelet, and sealing glass sealing the signal lead in the through hole. The signal lead includes a first portion, a second portion and a third portion that are greater in diameter than the first portion and on opposite sides of the first portion, a first tapered portion extending from the second portion to the first portion, and a second tapered portion extending from the third portion to the first portion. The first portion and the first and second tapered portions are buried in the sealing glass. The total length of a part of the second portion in the sealing glass and a part of the third portion in the sealing glass is 0.2 mm or less.

5 Claims, 6 Drawing Sheets

(52) U.S. Cl.
CPC ............ *H01S 5/02256* (2013.01); *H01S 5/18* (2013.01); *H05K 1/115* (2013.01); *H05K 2201/095* (2013.01)

(58) Field of Classification Search
CPC ......... H01L 31/2005; H01S 3/00; H01S 5/18; H01S 5/22; H01S 5/2256
USPC ...... 174/258; 257/81, 82, 99, 433, 666, 676, 257/691; 206/316.1
See application file for complete search history.

(56) References Cited

U.S. PATENT DOCUMENTS

| | | | |
|---|---|---|---|
| 9,588,313 B2* | 3/2017 | Kimura | G02B 6/428 |
| 2005/0162808 A1* | 7/2005 | Nakai | H01L 33/483 |
| | | | 361/301.3 |
| 2006/0098701 A1* | 5/2006 | Hayashi | H01S 5/0427 |
| | | | 372/38.02 |
| 2007/0045786 A1* | 3/2007 | Zielke | C25D 5/022 |
| | | | 257/666 |
| 2007/0120134 A1* | 5/2007 | Oshima | H01S 5/02276 |
| | | | 257/81 |
| 2008/0203510 A1* | 8/2008 | Kawamura | H01L 31/0203 |
| | | | 257/433 |
| 2008/0303127 A1* | 12/2008 | Fujino | H01S 5/02276 |
| | | | 257/676 |
| 2009/0242926 A1* | 10/2009 | Kimura | H01L 23/055 |
| | | | 257/99 |
| 2011/0024313 A1* | 2/2011 | Nakai | H01L 33/486 |
| | | | 206/316.1 |
| 2016/0291266 A1* | 10/2016 | Kimura | G02B 6/428 |
| 2016/0352069 A1* | 12/2016 | Kimura | H01S 5/02212 |

* cited by examiner

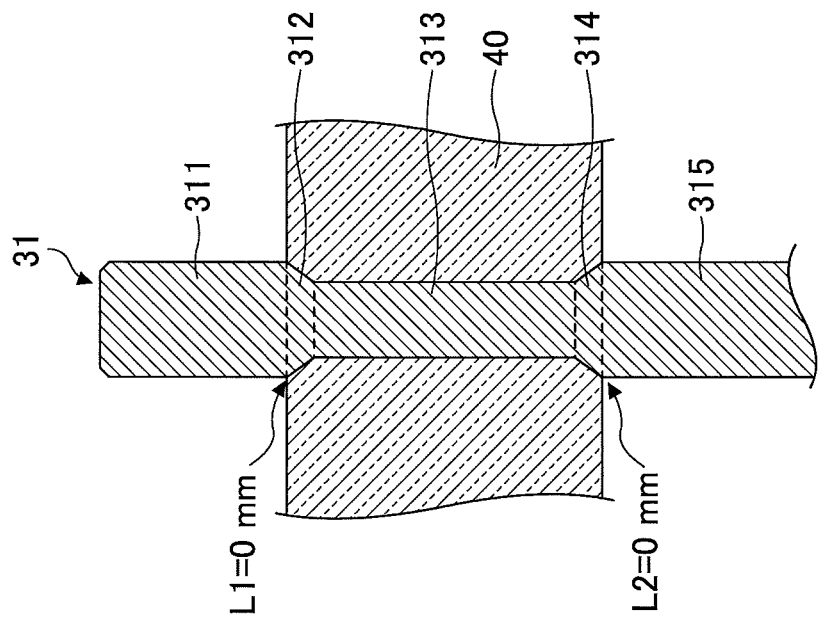
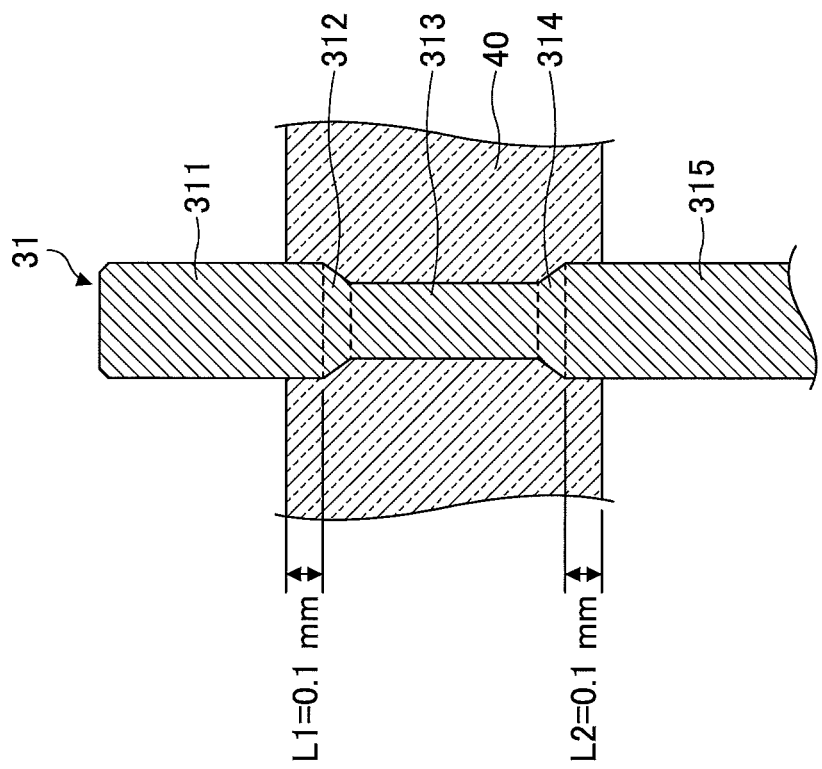

PACKAGE FOR OPTICAL SEMICONDUCTOR DEVICE

CROSS-REFERENCE TO RELATED APPLICATION

This application is based upon and claims the benefit of priority of the prior Japanese Patent Application No. 2016-002347, filed on Jan. 8, 2016, the entire contents of which are incorporated herein by reference.

FIELD

A certain aspect of the embodiment discussed herein is related to packages for an optical semiconductor device.

BACKGROUND

In optical communications, packages for an optical semiconductor device, such as the TO-46 package defined by JEDEC (the JEDEC Solid State Technology Association), are employed as packages for mounting a surface-emitting laser or a photodiode. According to common packages for an optical semiconductor device, leads (terminal parts) are inserted through holes formed through the package and are sealed with glass. Furthermore, according to packages for an optical semiconductor device, the characteristic impedance of a lead is matched to, for example, 50Ω per terminal to prevent a decrease in the efficiency of signal transmission during high-speed communications.

In packages for an optical semiconductor device, spatial restriction makes it difficult to enlarge a hole for inserting a lead to match the impedance per terminal to 50Ω. Therefore, consideration is given to decreasing the dielectric constant of sealing glass and reducing the wire diameter of a lead.

Reducing the wire diameter of a lead, however, not only makes the lead easily bendable but also prevents an area for wire boding from being created at the upper end of the lead. While the lead may be processed into a so-called "nail lead" that is wider at the upper end, the small wire diameter of the lead makes it difficult to perform stable processing.

Thus, there is a limit to the reduction of the wire diameter of a lead. Therefore, studies have been made of designing the shape of a lead to reduce the wire diameter in part of the lead.

Reference may be made to, for example, Japanese Laid-open Patent Publication No. 2009-105284 for related art.

SUMMARY

According to an aspect of the present invention, a package for an optical semiconductor device includes an eyelet, a signal lead inserted in a through hole formed in the eyelet, and sealing glass sealing the signal lead in the through hole. The signal lead includes a first portion, a second portion and a third portion that are greater in diameter than the first portion and on opposite sides of the first portion, a first tapered portion extending from the second portion to the first portion, and a second tapered portion extending from the third portion to the first portion. The first portion and the first and second tapered portions are buried in the sealing glass. The total length of a part of the second portion in the sealing glass and a part of the third portion in the sealing glass is 0.2 mm or less.

The object and advantages of the embodiment will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF DRAWINGS

FIGS. 3A and 3B are diagrams illustrating the shape of the first and second leads and the positional relationship between the first and second leads and the sealing glass;

DESCRIPTION OF EMBODIMENTS

Figure 1A:
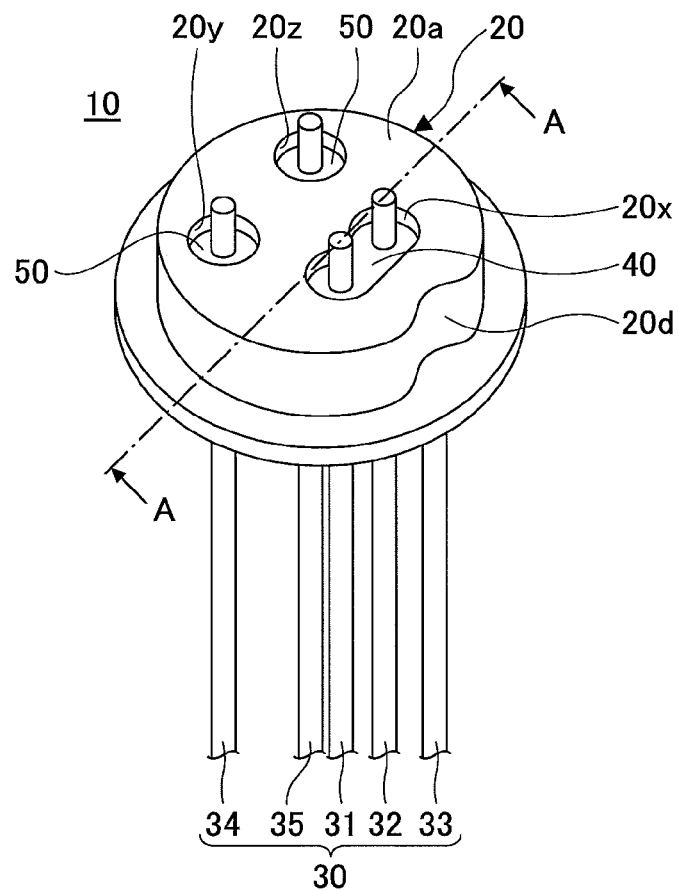
FIGS. 1A and 1B are diagrams depicting a package for an optical semiconductor device according to an embodiment.

In designing the shape of a lead, it is desired to give sufficient consideration to mass productivity. For example, forming a step in a lead to reduce the wire diameter in part of the lead, which is feasible in the case where cutting is employed as a processing technique, is not practical in the case of employing stamping as a processing technique in view of mass productivity. This is because by stamping, it is difficult to provide the lead with a step where portions different in wire diameter are directly adjacent to each other.

Furthermore, in designing the shape of a lead, sufficient consideration has not been given to the reflection characteristic due to impedance mismatch.

According to an aspect of the present invention, a package for an optical semiconductor device with good mass productivity and a good reflection characteristic is provided.

One or more preferred embodiments of the present invention will be explained with reference to accompanying drawings. In the drawings, the same element is referred to using the same reference numeral, and a repetitive description thereof may be omitted.

Figure 1B:
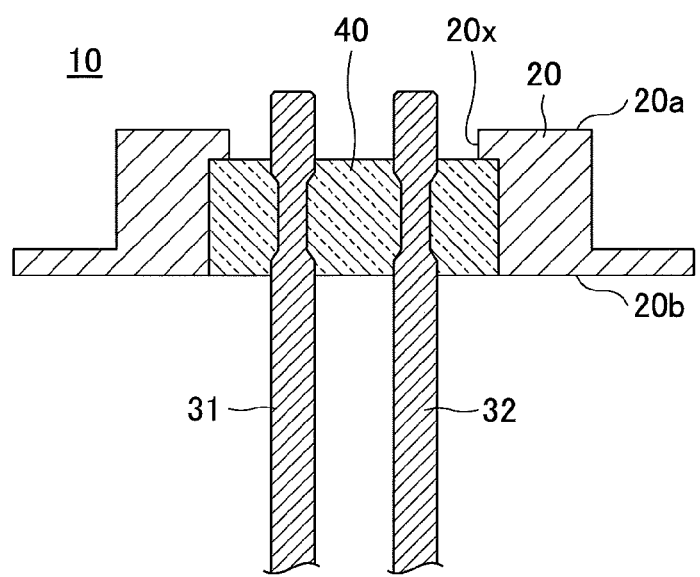

First, a structure of a package for an optical semiconductor device according to an embodiment is described with reference to FIGS. 1A and 1B. FIG. 1A is a perspective view of the package according to this embodiment. FIG. 1B is a cross-sectional view of the package, taken along the line A-A of FIG. 1A.

Referring to FIGS. 1A and 1B, a package 10 for an optical semiconductor device (hereinafter, "package 10") according to this embodiment includes an eyelet 20, leads 30, sealing glass 40, and sealing glass 50.

The eyelet 20 is a substantially disk-shaped part, and is increased in diameter to form a circular flange at its lower end. Part of a peripheral surface of the eyelet 20 is depressed toward the center of the eyelet 20 to form a depression 20d. In a plan view, the depression 20d has, for example, a substantial V shape, and may be used to, for example, position a light-emitting device relative to the package 10 when mounting the light-emitting device on the package 10.

The eyelet 20 may be formed of a metal material such as kovar (a nickel-cobalt ferrous alloy) or an iron-nickel alloy. A surface of the eyelet 20 may be plated. The eyelet 20 may be manufactured using, for example, a cold forging stamping.

According to embodiments of the present invention, the term "disk-shaped" refers to being of a substantially circular planar shape having a predetermined thickness, irrespective of the size of thickness relative to the diameter. The substantially circular planar shape may be partly depressed or projecting.

The leads 30 include a first lead 31, a second lead 32, a third lead 33, a fourth lead 34, and a fifth lead 35.

The first lead 31 and the second lead 32 are signal leads. The first lead 31 and the second lead 32 are inserted in a through hole 20x (elongated hole) that pierces through the eyelet 20 in its thickness direction, with a longitudinal direction of the first and second leads 31 and 32 coinciding with the thickness direction of the eyelet 20. The sealing glass 40 is provided around the first lead 31 and the second lead 32 to seal the first and second leads 31 and 32. The wire diameter of the first lead 31 and the second lead 32 is as described below. The first lead 31 and the second lead 32 have respective upper ends projecting upward approximately 0 mm to approximately 0.05 mm from an upper surface 20a of the eyelet 20. The first lead 31 and the second lead 32 have respective lower ends projecting downward approximately 6 mm to approximately 20 mm from a lower surface 20b of the eyelet 20.

The first lead 31 and the second lead 32 are formed of a metal such as kovar (a nickel-cobalt ferrous alloy) or an iron-nickel alloy. The first lead 31 and the second lead 32 are configured to have their respective upper ends electrically connected to, for example, a light-emitting device to be mounted on the package 10. In the case of mounting a light-receiving device as well on the package 10, the upper ends of the first lead 31 and the second lead 32 may also be electrically connected to the light-receiving device. Furthermore, the number of leads to be connected to a light-emitting device and/or a light-receiving device may be increased.

While the first lead 31 and the second lead 32 may be inserted separately in independent through holes the same as the fourth lead 34 and the fifth lead 35, the first lead 31 and the second lead 32 are inserted in the same through hole 20x to produce a space saving effect.

The third lead 33 is a ground lead. The third lead 33 may have a wire diameter of, for example, approximately 0.35 mm. The third lead 33 is joined to the lower surface 20b of the eyelet 20 by, for example, welding, to project downward approximately 6 mm to approximately 20 mm from the lower surface 20b of the eyelet 20, with a longitudinal direction of the third lead 33 coinciding with the thickness direction of the eyelet 20. The third lead 33 is formed of a metal such as kovar (a nickel-cobalt ferrous alloy) or an iron-nickel alloy. The third lead 33 is joined to the eyelet 20 to be electrically connected to the eyelet 20. Accordingly, when the third lead 33 is grounded, the eyelet 20 is also grounded.

The fourth lead 34 and the fifth lead 35 are power supply leads. The fourth lead 34 is inserted in a through hole 20y that pierces through the eyelet 20 in its thickness direction, with a longitudinal direction of the fourth lead 34 coinciding with the thickness direction of the eyelet 20. The sealing glass 50 is provided around the fourth lead 34 to seal the fourth lead 34. The fifth lead 35 is inserted in a through hole 20z that pierces through the eyelet 20 in its thickness direction, with a longitudinal direction of the fifth lead 35 coinciding with the thickness direction of the eyelet 20. The sealing glass 50 is provided around the fifth lead 35 to seal the fifth lead 35. The fourth lead 34 and the fifth lead 35 may have a wire diameter of, for example, approximately 0.35 mm.

The fourth lead 34 and the fifth lead 35 have respective upper ends projecting upward approximately 0 mm to approximately 0.05 mm from the upper surface 20a of the eyelet 20. The fourth lead 34 and the fifth lead 35 have respective lower ends projecting downward approximately 6 mm to approximately 20 mm from the lower surface 20b of the eyelet 20. The fourth lead 34 and the fifth lead 35 are formed of a metal such as kovar.

The dielectric constant of the sealing glass 40 that seals the first lead 31 and the second lead 32, which are signal leads, is lower than the dielectric constant of the sealing glass 50 that seals the fourth lead 34 and the fifth lead 35, which are power supply leads. For example, the dielectric constant of the sealing glass 40 may be adjusted to be lower than the dielectric constant of the sealing glass 50 by causing the sealing glass 40 to contain air bubbles and controlling the amount of air bubbles contained in the sealing glass 40. The dielectric constant of the sealing glass 40 depends on the quality of a material used for the sealing glass 40 and additives to the sealing glass 40. Therefore, the amount of air bubbles contained in the sealing glass 40 is suitably determined in accordance with the quality of a material used for the sealing glass 40, etc. Containing air bubbles in the sealing glass 40 does not decrease the hermeticity of the sealing provided by the sealing glass 40.

Figure 2:
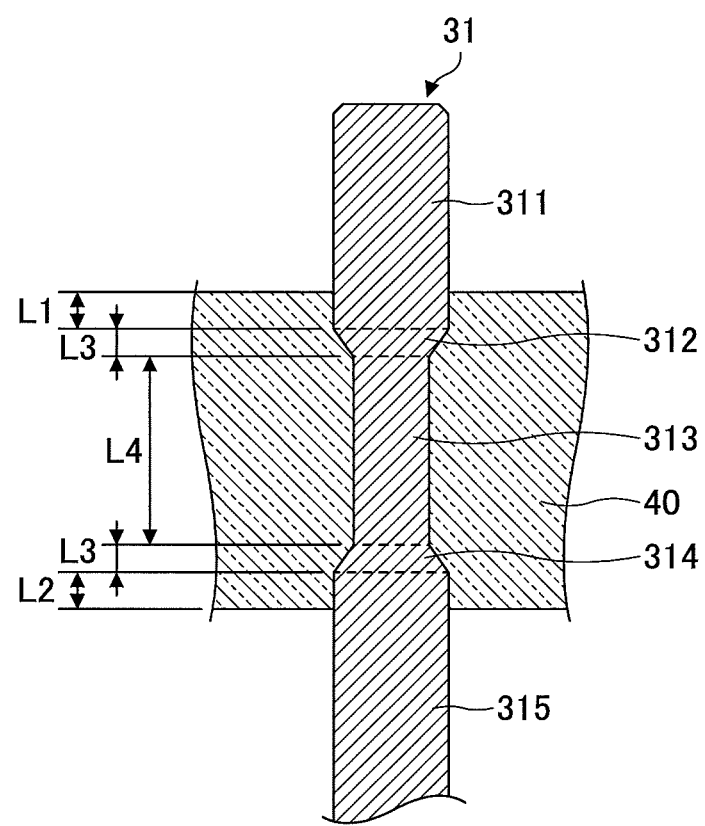
FIG. 2 is a diagram illustrating the shape of a first lead and a second lead and the positional relationship between the first and second leads and sealing glass.

Next, the shape of the first lead 31 and the second lead 32 and the positional relationship between the first and second leads 31 and 32 and the sealing glass 40 are described with reference to FIGS. 2, 3A and 33. While the following description is given, taking the first lead 31 as an example as depicted in FIGS. 2, 3A and 33, the description is also applicable to the second lead 32.

The first lead 31 includes a large-diameter portion 311, a tapered portion 312, a small-diameter portion 313, a tapered portion 314, and a large-diameter portion 315, which are concentrically and monolithically formed by, for example, stamping. In the longitudinal direction of the first lead 31, the large-diameter portions 311 and 315 are positioned on opposite sides of the small-diameter portion 313 with the tapered portions 312 and 314 interposed between the large-diameter portion 311 and the small-diameter portion 313 and between the large-diameter portion 315 and the small-diameter portion 313, respectively. In FIGS. 2, 3A and 3B, the boundary between adjacent portions among the large-diameter portion 311, the tapered portion 312, the small-diameter portion 313, the tapered portion 314, and the large-diameter portion 315 is indicated by the dotted line for convenience of depiction.

A first (upper) end of the large-diameter portion 311 is a free end to be connected by, for example, a wire, to a light-emitting device to be mounted on the package 10. The tapered portion 312 extends between a second (lower) end of the large-diameter portion 311 and a first (upper) end of the small-diameter portion 313. The tapered portion 312 is tapered toward the small-diameter portion 313. The tapered portion 314 extends between a second (lower) end of the small-diameter portion 313 and a first (upper) end of the large-diameter portion 315. The tapered portion 314 is tapered toward the small-diameter portion 313. A second (lower) end of the large-diameter portion 315 is a free end. The large-diameter portion 311, the tapered portion 312, the small-diameter portion 313, the tapered portion 314, and the large-diameter portion 315 form a monolithic structure.

Thus, the tapered portions 312 and 314 are provided at points where the wire diameter changes, that is, the tapered portions 312 and 314 are inserted between portions having different wire diameters, to gradually change the wire diameter. As a result, it is possible to obtain a highly mass-productive and reliable lead without sacrificing the reflection characteristic. Here, it is assumed that no tapered portion is provided at a changing point of the wire diameter so that the wire diameter suddenly changes at the step-shaped changing point in the lead. Such a lead may be manufactured by cutting, but is difficult to manufacture using stamping in view of mass productivity. That is, in the case of stamping, when forging processes such as drawing and swaging are performed in a die (or between dies), a lubricant may deposit at the corner (edge) of a step-shaped portion of the die to prevent a raw material from flowing well into the die. This makes it difficult to shape a lead as desired, so that the shape stability of manufactured leads becomes poor. Furthermore, the load on the die increases.

Furthermore, in the case of applying a stress to a portion of a lead where the wire diameter changes, the stress may concentrate on the portion and cause the lead to bend. Furthermore, in the case of forming the sealing glass 40 with different kinds of materials having different coefficients of thermal expansion and sealing a lead with the sealing glass 40, a stress concentrates on a portion of the sealing glass 40 near the corner of a step-shaped portion of the lead, so that a crack or the like is likely to be caused in the portion of the sealing glass 40. In addition, it is likely that, in the portion of the sealing glass 40 near the corner portion of the step-shaped portion of the lead, incorporated air bubbles cannot escape so that air bubbles different from air bubbles intentionally contained in the sealing glass 40 are generated as so-called "captured air bubbles."

These problems can be solved by providing the tapered portions 312 and 314 at the changing points of the wire diameter.

The large-diameter portions 311 and 315 may have a wire diameter of, for example, approximately 0.35 mm. The small-diameter portion 313 may have a wire diameter of, for example, approximately 0.21 mm. Each of the tapered portions 312 and 314 may have a length L3 of, for example, approximately 0.1 mm. The taper angle of the tapered portions 312 and 314 is preferably 45 degrees or less, and may be, for example, approximately 35 degrees.

Each of the small-diameter portion 313, the tapered portion 312, and the tapered portion 314 is positioned in its entirety, that is, buried, in the sealing glass 40. Furthermore, the total of a length L1 of a part of the large-diameter portion 311 in the sealing glass 40 and a length L2 of a part of the large-diameter portion 315 in the sealing glass 40 is 0.2 mm or less. For example, as depicted in FIG. 3A, the length L1 may be 0.1 mm and the length L2 may be 0.1 mm. As another example, as depicted in FIG. 3B, the length L1 may be 0 mm and the length L2 may be 0 mm. In this case, no parts of the large-diameter portions 311 and 315 are present or buried in the sealing glass 40. That is, the large-diameter portions 311 and 315 are exposed in their entirety outside the sealing glass 40. FIGS. 3A and 3B, however, depict non-limiting examples, and the length L1 and the length L2 may be any values that satisfy the condition of L1+L2≤0.2 mm. The length L1 and the length L2 may be different values.

The reason to satisfy L1+L2≤0.2 mm in the first lead 31 and the second lead 32 is that it is possible to reduce reflections due to impedance mismatch in the sealing glass 40 and impedance mismatch in air. By reducing reflections due to impedance mismatch, an impedance value for high-speed communications may be designed to be a specific value, taking other conditions into consideration. For example, in the case of using the first lead 31 and the second lead 32 for differential transmission, it is possible to approximate the differential impedance to 100Ω (50 Ω+50Ω). As a result, it is possible to realize the package 10 having good transmission characteristics. Here, the "other conditions" include the size of the through hole 20x, the wire diameter of the first lead 31 and the second lead 32, and the dielectric constant of the sealing glass 40.

The reason to satisfy L1+L2≤0.2 mm is described in more detail below through examples (simulations).

EXAMPLES

[Simulation 1]

The reflection characteristic, which is an important electrical characteristic, is simulated with respect to the case of using the first lead 31 and the second lead 32 having the shape as depicted in FIGS. 1A, 1B and 2 for differential transmission. The target value of the impedance of the first lead 31 and the second lead 32 is set to 100 Ω (50 Ω+50 Ω because of use for differential transmission), and the conditions of the first lead 31 and the second lead 32, such as dimensions, are determined as described below.

Specifically, in the configuration as depicted in FIGS. 1A, 1B and 2, the length (thickness) of the sealing glass 40 is set to 0.9 mm, the dielectric constant of the sealing glass 40 is set to 4.4, the width of the through hole 20x (the dimension of the through hole 20x in a direction perpendicular to its longitudinal direction in a plan view) is set to 1.2 mm, the wire diameter of the large-diameter portions 311 and 315 is set to 0.35 mm, the wire diameter of the small-diameter portion 313 is set to 0.21 mm, the length L3 of the tapered portions 312 and 314 is set to 0.1 mm, and the taper angle of the tapered portions 312 and 314 is set to 35 degrees, and the reflection characteristic in the case of varying a length L4 of the small-diameter portion 313 from 0 mm to 1.1 mm in a stepwise manner is examined.

The same simulation is also performed with respect to an idealized model. Here, the "idealized model" refers to a model having a stepped shape without the tapered portions 312 and 314 between the large-diameter portions 311 and 315 and the small-diameter portion 313. The shape of the idealized model is ideal when the electrical characteristics are considered, but is not suitable for actual processing using a die or dies as described above. In contrast, the shape having the tapered portions 312 and 314 is suitable for actual processing using a die or dies.

Figure 4A:
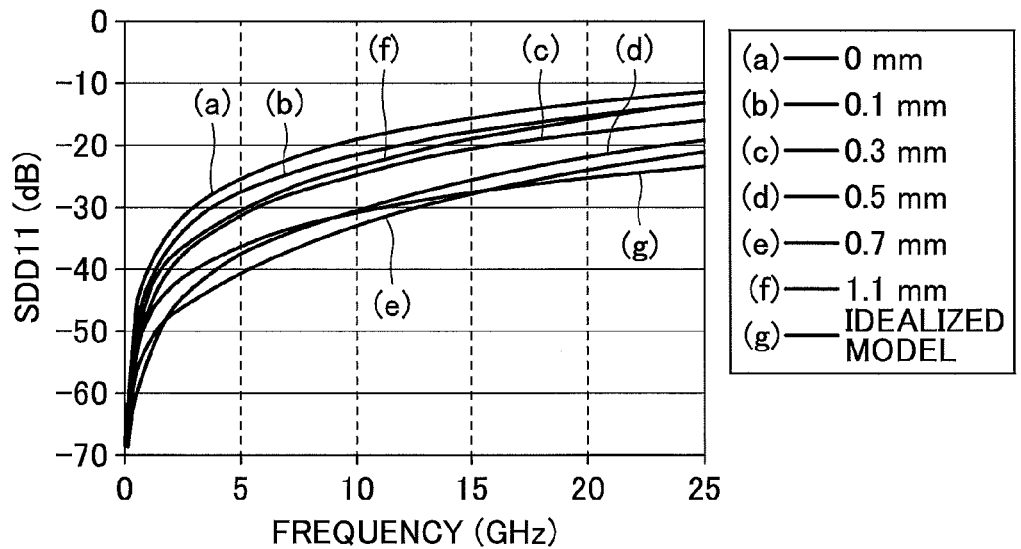
FIGS. 4A and 4B illustrate a reflection characteristic of the package according to the embodiment.

The results are presented in FIG. 4A. The horizontal axis of FIG. 4A represents frequency (GHz), and the vertical axis of FIG. 4A represents SDD11 (dB). SDD11 is an index that indicates a reflection characteristic under the differential end condition. A smaller SDD11 value is more preferable at each frequency.

Figure 4B:
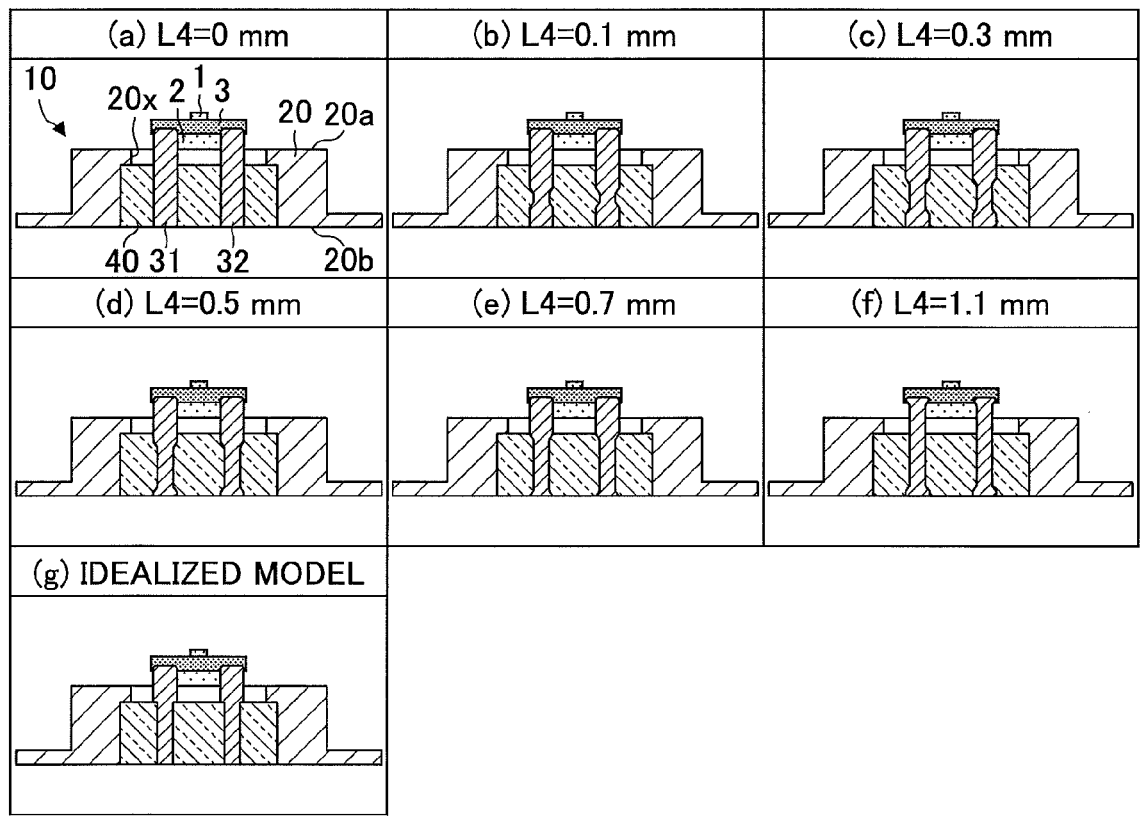

FIG. 4B schematically illustrates the length L4 of the simulated small-diameter portion 313. Each model assumes that a light-emitting device is connected to leads. According to the actual structure, the first lead 31 and the second lead 32 are connected to a light-emitting device 1 by bonding wires, while in the simulation models, an analytical structure for clearly indicating the influence exerted on the reflection characteristic by the structural difference of the first lead 31 and the second lead 32, omitting the influence of bonding wires on the reflection characteristic, is employed.

Specifically, a submount 2 on which the light-emitting device 1 is mounted is mounted on the eyelet 20. The upper ends of the first lead 31 and the second lead 32 are connected to a perfect conductor sheet 3, and the perfect conductor sheet 3 is connected to the light-emitting device 1. Furthermore, the light-emitting device 1 is a perfect conductor model, and is grounded the same as the eyelet 20. While being depicted in FIG. 4B for convenience of description, the light-emitting device 1 is actually on the bottom side of the cross sections depicted in FIG. 4B (the same as the cross section of FIG. 1B) in the direction going into the plane of paper (that is, on the center side of the eyelet 20) with the submount 2 extending in the direction going into the plane of paper.

FIG. 4A demonstrates that the reflection characteristic improves as the length L4 of the small-diameter portion 313 changes from 0 mm to 0.7 mm. The reflection characteristic, however, degrades when the length L4 of the small-diameter portion 313 is 1.1 mm. It is believed that this is because the small-diameter portion 313 projects into the air so that an increase in the differential impedance in the air becomes more dominant to cause a high impedance mismatch.

Furthermore, FIG. 4A demonstrates that when the length L4 of the small-diameter portion 313 is in the range of 0.5 mm to 0.7 mm with the length of the sealing glass 40 being 0.9 mm, it is possible to obtain the reflection characteristic close to that of the idealized model up to a high-frequency range. Furthermore, it is understood from FIG. 4A that the change of the reflection characteristic is subject to the difference of the length L4 of the small-diameter portion 313 in the sealing glass 40 and that the influence of the presence or absence of the tapered portions 312 and 314 on the change of the reflection characteristic is limited.

Figure 5A:
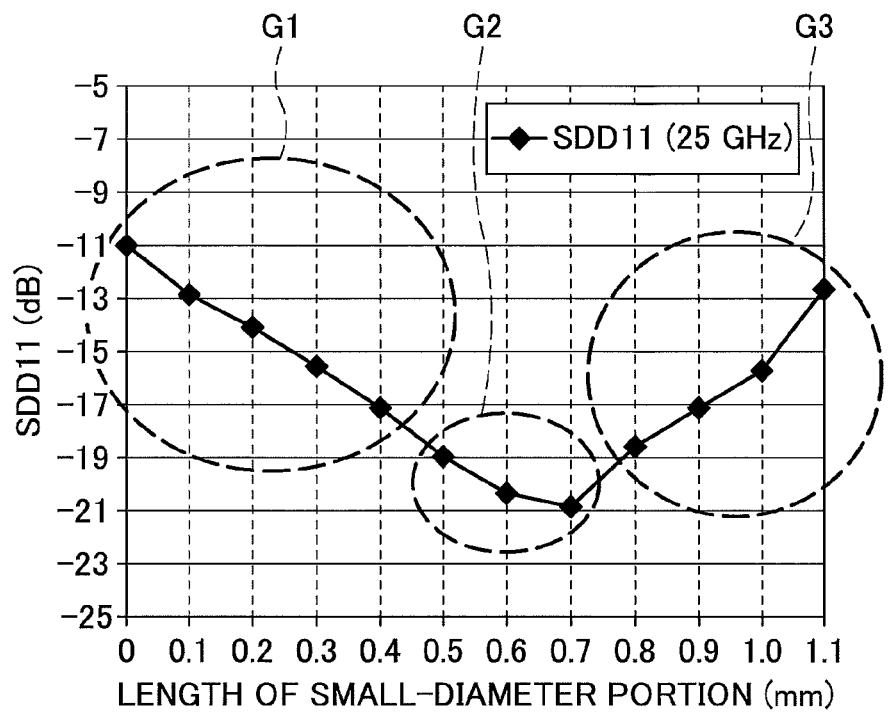
FIGS. 5A and 5B illustrate the reflection characteristic of the package according to the embodiment.
Figure 5B:
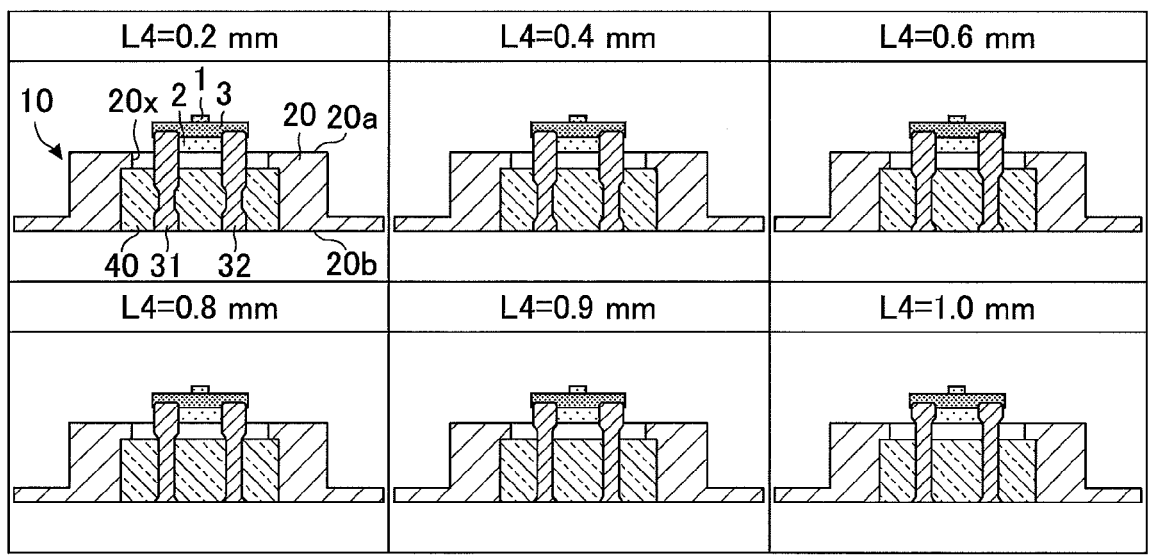

Next, the data at a frequency of 25 GHz in the results of FIG. 4A are plotted with respect to each length L4 of the small-diameter portion 313 in the graph of FIG. 5A. That is, the horizontal axis of the graph of FIG. 5A represents the length L4 (mm) of the small-diameter portion 313, and the vertical axis of the graph of FIG. 5A represents SDD11 (dB). Furthermore, the graph of FIG. 5A also includes the data of the samples depicted in FIG. 5B.

As indicated in FIG. 5A, the impedance mismatch is divided into three Groups G1 through G3, and the importance of characteristic impedance matching in each of the sealing glass 40 and air can be confirmed. Group G1 is a group where the reflection due to impedance mismatch in the sealing glass 40 is dominant. Group G3 is a group where the reflection due to impedance mismatch in air is dominant. In contract, Group G2 is a group that is lower in impedance mismatch in the sealing glass 40 and air than Groups G1 and G3 to present a good characteristic impedance.

Here, a threshold (the target reflection characteristic of SDD11) for determining whether the impedance mismatch is high or low is set to −19 dB, which is an indication of the characteristic commercially required for packages for an optical semiconductor device.

It is found from FIG. 5A that when the threshold (the target reflection characteristic of SDD11) is −19 dB, the length L4 of the small-diameter portion 313 has to be 0.5 mm to 0.7 mm with respect to the length of 0.9 mm of the sealing glass 40. Here, subtracting the total length of 0.2 mm of the tapered portions 312 and 314 from the length of 0.9 mm of the sealing glass 40 results in a remainder of 0.7 mm. Accordingly, it can be said that the target reflection characteristic cannot be obtained unless the permissible length of the impedance mismatch portion (the total length of the parts of the large-diameter portions 311 and 315 in the sealing glass 40) is set to 0.2 mm or less.

[Simulation 2]

Next, the influence of the length of the sealing glass 40 is examined. First, the two samples depicted in FIGS. 3A and 3B, namely a sample in which the length of the impedance mismatch portion (the total length of the parts of the large-diameter portions 311 and 315 in the sealing glass 40) is 0.2 mm and a sample in which the length of the impedance mismatch portion is 0 mm, are prepared. With respect to each sample, the length of the sealing glass 40 is changed from 0.9 mm to 1.2 mm to 1.5 mm, and the influence of the change of the length is examined.

The length of 1.2 mm and the length of 1.5 mm are dimensions commonly employed for glass-sealed packages for a semiconductor device. Furthermore, in the case of the length of 0.9 mm, 0.2 mm of the glass-sealed portion of a package for a semiconductor device in which the glass-sealed portion is supposed to be 1.1 mm in length is not sealed with glass, with a view to matching the differential impedance to 100Ω with an air layer and also increasing an area for mounting, for example, a laser or a photodetector.

Figure 6:
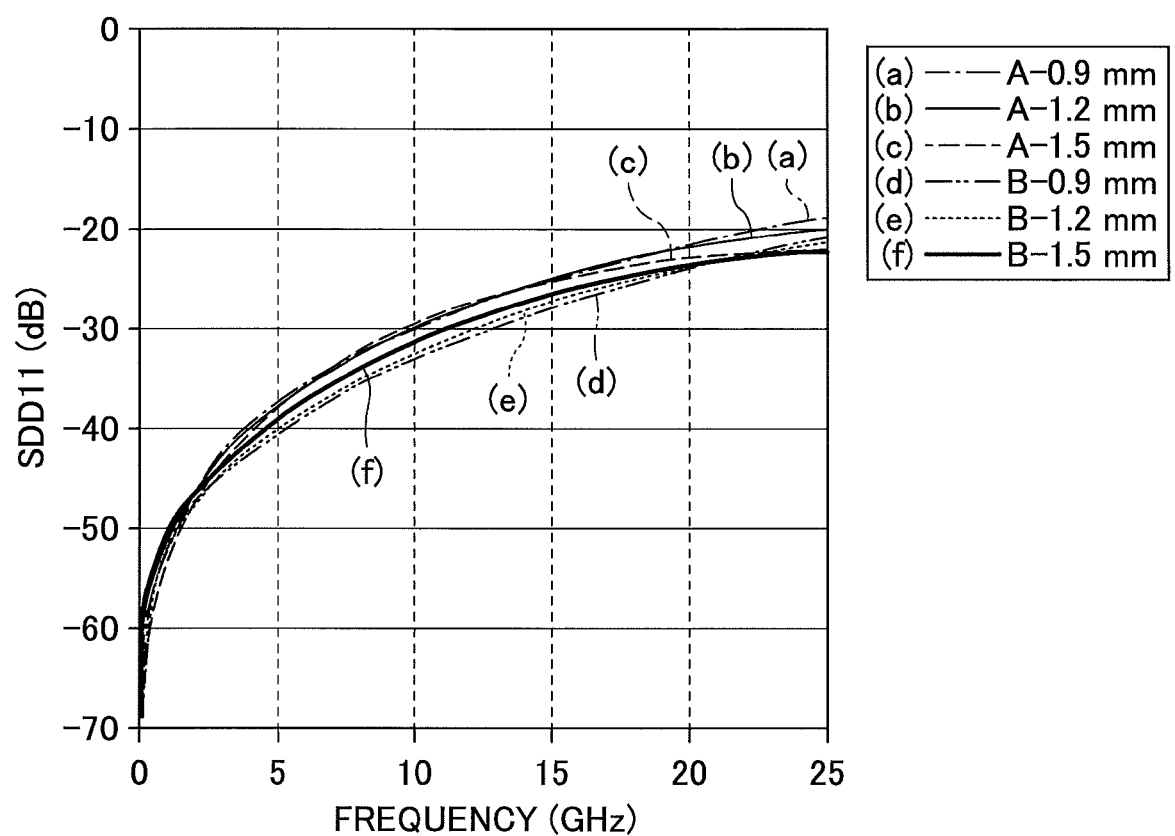
FIG. 6 is a graph illustrating the reflection characteristic of the package according to the embodiment.

The results are presented in FIG. 6. The horizontal axis of the graph of FIG. 6 represents frequency (GHz) and the vertical axis of the graph of FIG. 6 represents SDD11 (dB). Furthermore, A-0.9 mm, A-1.2 mm, and A-1.5 mm indicate the data of a group where the length of the impedance mismatch portion is 0.2 mm (hereinafter, "Group A"), and B-0.9 mm, B-1.2 mm, and B-1.5 mm indicate the data of a group where the length of the impedance mismatch portion is 0 mm (hereinafter, "Group B").

It can be confirmed from FIG. 6 that while the reflection characteristic slightly differs between Group A and Group B, in general, the reflection characteristic is hardly affected by the length of the sealing glass 40.

Experiment 1

It was determined, with respect to the first lead 31 and the second lead 32 of the shape depicted in FIGS. 1A, 1B and 2, whether air bubbles other than those originally contained were generated near the tapered portions 312 and 314 in the sealing glass 40 in the case of causing air bubbles to be contained in the sealing glass 40. The experiment was conducted with respect to ten samples, and no generation of air bubbles was observed in any of the samples. Furthermore, no glass cracks were caused near the tapered portions 312 and 314 in any of the samples.

Experiment 2

A cap with window glass was welded onto the eyelet 20 of the package 10 as depicted in FIGS. 1A and 1B by electric resistance welding. Air bubbles were contained in the sealing glass 40. Next, the package 10 on which the cap was welded was left in an environment of a temperature of 121° C., a humidity of 100%, and an atmospheric pressure of 2 atm for 280 hours, and the presence or absence of moisture penetration into the cap was determined through the window glass. The experiment was conducted with respect to ten samples, and no moisture penetration was observed in any of the samples. That is, it was confirmed that containing air bubbles in the sealing glass 40 does not decrease the hermeticity of the sealing provided by the sealing glass 40.

SUMMARY

To sum up the results of Simulations 1 and 2 described above, the following points carry weight to improve the reflection characteristic.

First, it is preferable that each of the small-diameter portion 313, the tapered portion 312, and the tapered portion 314 be buried in the sealing glass 40.

Secondly, it is more preferable that the small-diameter portion 313, which is buried in the sealing glass 40, is longer, and it is more preferable that a shorter part of each of the large-diameter portions 311 and 315 is in the sealing glass 40. Taking the required reflection characteristic into consideration, the permissible total length of the parts of the large-diameter portions 311 and 315 in the sealing glass 40 is 0.2 mm or less, independent of the length of the sealing glass 40.

Thirdly, the length of the small-diameter portion 313 buried in the sealing glass 40 is dominant, and the influence of the presence or absence of the tapered portions 312 and 314 is limited.

All examples and conditional language provided herein are intended for pedagogical purposes of aiding the reader in understanding the invention and the concepts contributed by the inventors to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

For example, while two signal leads are inserted in a single hole according to the above-described embodiment, a single signal lead may alternatively be inserted in a single hole. Furthermore, while two signal leads are used for differential transmission according to the above-described embodiment, two signal leads may alternatively be used independent of each other. In addition, the number of leads included in a package for an optical semiconductor device may be determined as desired. In any of these cases, it is possible to achieve a good reflection characteristic by satisfying the above-described conditions.

What is claimed is:

1. A package for an optical semiconductor device, comprising:
    an eyelet;
    a signal lead inserted in a through hole formed in the eyelet; and
    sealing glass sealing the signal lead in the through hole, wherein the signal lead includes
        a first portion;
        a second portion and a third portion that are greater in diameter than the first portion and on opposite sides of the first portion; and
        a first tapered portion extending from the second portion to the first portion and a second tapered portion extending from the third portion to the first portion,
    wherein the first portion and the first and second tapered portions are buried in the sealing glass, and
    wherein a total length of a part of the second portion in the sealing glass and a part of the third portion in the sealing glass is 0.2 mm or less.

2. The package as claimed in claim 1, wherein the sealing glass contains air bubbles.

3. The package as claimed in claim 1, further comprising:
    another signal lead inserted in the through hole, said another signal lead having a same configuration as the signal lead,
    wherein the sealing glass further seals said another signal lead in the through hole.

4. The package as claimed in claim 1, wherein the total length is 0 mm or more.

5. The package as claimed in claim 1, wherein the second portion and the third portion are partly or entirely exposed outside the sealing glass.

* * * * *